(12) United States Patent
Ramsey et al.

(10) Patent No.: US 8,491,315 B1
(45) Date of Patent: Jul. 23, 2013

(54) MICRO VIA ADAPTER SOCKET

(75) Inventors: James M. Ramsey, Frisco, TX (US); Jose L. Ortega, Irving, TX (US)

(73) Assignee: Plastronics Socket Partners, Ltd., Irving, TX (US)

( * ) Notice: Subject to any disclaimer, the term of this patent is extended or adjusted under 35 U.S.C. 154(b) by 0 days.

(21) Appl. No.: 13/306,979

(22) Filed: Nov. 29, 2011

(51) Int. Cl.
*H01R 12/00* (2006.01)

(52) U.S. Cl.
USPC .............................................. 439/66; 439/71

(58) Field of Classification Search
USPC .................................... 439/66, 68, 69, 70, 71
See application file for complete search history.

(56) References Cited

U.S. PATENT DOCUMENTS

| 7,419,382 | B2* | 9/2008 | Suzuki et al. | 439/70 |
| 7,423,222 | B2* | 9/2008 | Sugawa et al. | 174/264 |
| 7,458,818 | B2* | 12/2008 | Kiyofuji et al. | 439/66 |
| 7,666,000 | B1* | 2/2010 | Hsiao et al. | 439/66 |
| 7,726,984 | B2* | 6/2010 | Bumb et al. | 439/91 |
| 7,821,283 | B2* | 10/2010 | Yamada et al. | 324/762.05 |
| 7,837,481 | B1* | 11/2010 | Mahoney et al. | 439/81 |
| 7,845,955 | B2* | 12/2010 | Nakayama et al. | 439/66 |
| 7,887,336 | B2* | 2/2011 | Nikaido et al. | 439/66 |
| 7,922,498 | B2* | 4/2011 | Lin | 439/71 |
| 7,943,859 | B2* | 5/2011 | Ambo et al. | 174/261 |
| 7,950,927 | B2* | 5/2011 | Kazama et al. | 439/66 |
| 8,007,287 | B1* | 8/2011 | Champion et al. | 439/66 |
| 8,033,835 | B2* | 10/2011 | Mulfinger et al. | 439/66 |
| 8,287,288 | B2* | 10/2012 | Chang et al. | 439/66 |
| 8,344,747 | B2* | 1/2013 | Kazama et al. | 324/755.01 |
| 2002/0055283 | A1* | 5/2002 | Yoon et al. | 439/66 |
| 2002/0081869 | A1* | 6/2002 | Abbott | 439/66 |
| 2003/0087538 | A1* | 5/2003 | Ueno | 439/68 |
| 2003/0190825 | A1* | 10/2003 | Sasaki | 439/66 |
| 2004/0005790 | A1* | 1/2004 | Sprietsma et al. | 439/66 |
| 2004/0072456 | A1* | 4/2004 | Dozier et al. | 439/83 |
| 2004/0107568 | A1* | 6/2004 | Khandros et al. | 29/840 |
| 2004/0253846 | A1* | 12/2004 | Brown et al. | 439/66 |
| 2004/0266224 | A1* | 12/2004 | Watson | 439/66 |
| 2005/0009381 | A1* | 1/2005 | Fan et al. | 439/66 |
| 2005/0208789 | A1* | 9/2005 | Shirai et al. | 439/66 |
| 2006/0154496 | A1* | 7/2006 | Imamura et al. | 439/66 |
| 2006/0199402 | A1* | 9/2006 | Ishii et al. | 439/66 |
| 2006/0228914 | A1* | 10/2006 | Oda | 439/71 |
| 2006/0258182 | A1* | 11/2006 | Dittmann | 439/66 |
| 2007/0111557 | A1* | 5/2007 | Higashiguchi et al. | 439/66 |
| 2007/0111560 | A1* | 5/2007 | Kazama et al. | 439/71 |
| 2007/0184677 | A1* | 8/2007 | Sukegawa et al. | 439/66 |
| 2007/0238324 | A1* | 10/2007 | Ho | 439/66 |
| 2007/0245553 | A1* | 10/2007 | Chong et al. | 29/843 |
| 2007/0259540 | A1* | 11/2007 | Taylor | 439/68 |

(Continued)

*Primary Examiner* — Ross Gushi
(74) *Attorney, Agent, or Firm* — Mark W Handley (57) ABSTRACT

A micro via adapter socket (12) is provided by a printed circuit board (30) having an upper layer (32), a lower layer (40) and intermediate interconnect layers (34, 36 and 38). The lower layer (32) has an array of mini vias (60) formed therein for receiving respective ones of mini-springs (62). A top plate (42) is secured above the upper layer (32). The top plate (42) has a plurality of micro-pin recesses (54) spaced apart for registering with respective ones of the micro vias (48) and receiving micro-pins (52). A bottom plate (44) is secured beneath the lower layer (40). The bottom plate (44) has a plurality of mini-pin recesses (66) for removably receiving respective ones of the mini-pins (64). The intermediate interconnect layers (34, 36 and 38) have conductive tracks (76) which electrically connect between the micro vias (48) and the mini vias (60).

14 Claims, 5 Drawing Sheets

U.S. PATENT DOCUMENTS

| | | | |
|---|---|---|---|
| 2007/0264846 A1* | 11/2007 | Takagi | 439/71 |
| 2007/0269997 A1* | 11/2007 | Eldridge et al. | 439/66 |
| 2008/0076276 A1* | 3/2008 | Takezaki et al. | 439/71 |
| 2008/0078572 A1* | 4/2008 | Watanabe et al. | 174/262 |
| 2008/0171452 A1* | 7/2008 | Yakabe et al. | 439/66 |
| 2009/0035957 A1* | 2/2009 | Garrison | 439/66 |
| 2009/0053911 A1* | 2/2009 | Kariya et al. | 439/68 |
| 2009/0102500 A1* | 4/2009 | An et al. | 324/761 |
| 2009/0113698 A1* | 5/2009 | Love et al. | 29/739 |
| 2009/0189624 A1* | 7/2009 | Oh et al. | 324/754 |
| 2009/0197437 A1* | 8/2009 | Ouchi et al. | 439/68 |
| 2009/0253278 A1* | 10/2009 | Chen | 439/70 |
| 2010/0075514 A1* | 3/2010 | Williams | 439/66 |
| 2010/0120267 A1* | 5/2010 | Eldridge et al. | 439/66 |
| 2010/0167561 A1* | 7/2010 | Brown et al. | 439/66 |
| 2011/0070750 A1* | 3/2011 | Reisinger et al. | 439/66 |
| 2012/0202361 A1* | 8/2012 | Terhune, IV | 439/66 |

* cited by examiner

MICRO VIA ADAPTER SOCKET

TECHNICAL FIELD OF THE INVENTION

The present invention relates in general to component sockets, and in particular to component sockets for adapting electronic components for contacting circuitry.

BACKGROUND OF THE INVENTION

Package sizes and circuitry for electronic components are continually being miniaturized and further reduced in size. Such reductions in size lead to reduced spacing between package contacts. The spacing between contacts for electronic component packages are currently trending from spacings of 0.050 inches (1.25 mm) to 0.020 inches (0.50 mm), as measured centerline to centerline, or between centers, of adjacent contacts. Current development is directed toward components packages having contacts arrayed at 0.008 inches (0.20 mm) spacings. Continued reductions in spacings between contacts have resulted in increased costs and complexity for manufacturing sockets for receiving and electrically connecting the contacts of electronic components to circuitry. As the spacings between contacts are reduced, there remains a requirement of providing compliance between an array of contacts in a socket and the contacts of an electronic package. Compliance for small pitch contacts has typically been provided by conventional spring biased contacts which have a conductive metal barrel within which is mounted a contact pin and a bias spring. The spring biased pin will directly contact the conductive metal barrel to avoid impedance encountered when passing high frequencies through wound coils of the bias springs. With reduced spacing sizes for contacts of component packages, the physical limits are being reached at which conventional spring biased contacts may be used to provide compliance for component package connections.

SUMMARY OF THE INVENTION

A novel micro via adapter socket is disclosed for electrically connecting contacts of an electronic component package to associated external circuitry. The micro via adapter socket includes a printed circuit board having an upper layer, a lower layer and intermediate interconnect layers. A plurality of micro-springs and micro-pins, and a plurality of mini-springs and mini-pins are also provided, wherein the micro-springs and the micro-pins are substantially smaller in diameter than the mini-springs and the mini-pins. The upper layer has micro vias formed therein. The micro vias define a first array of blind vias for receiving respective ones of the micro-springs. The lower layer has mini vias formed therein. The mini vias define a second array of blind vias for receiving respective ones of the mini-springs. A top plate is secured above the upper layer. The top plate has a plurality of micro pin recesses spaced apart for registering with respective ones of the micro vias. The micro pin recesses are sized for removably receiving respective ones of the micro pins which are urged to extend outward of the top plate by respective ones of the micro-springs. The micro pin recesses are aligned with respective micro pin ports for passing an end of the micro-pins outward of the top plate. A bottom plate is secured beneath the lower layer. The bottom plate has a plurality of mini-pin recesses spaced apart for registering with respective ones of the mini vias. The mini-pin recesses are sized for removably receiving respective ones of the mini-pins which are urged to extend outward of the top plate by respective ones of the mini-springs. Each of the mini-pin recesses is aligned with a respective mini-pin port for passing an end of the micro pins outward of the top plate. The intermediate interconnect layers have conductive tracks which electrically connect the micro-pins to respective ones of the mini-pins. The micro vias have conductive plating which is electrically in contact with the micro-springs, and the vias having conductive plating which is electrically in contact with the mini-springs. The mini vias and the micro vias are electrically connected by conductive tracks formed on the intermediate, interconnect layers of the printed circuit board. The present invention illustrates application of printed circuit board technology in cooperation with miniaturized helical coil springs to accomplish reduced spacing beyond the limits of conventional spring biased contacts.

DESCRIPTION OF THE DRAWINGS

For a more complete understanding of the present invention and the advantages thereof, reference is now made to the following description taken in conjunction with the accompanying Drawings in which FIGS. 1 through 12 show various aspects for micro via adapter socket made according to the present invention, as set forth below:

DETAILED DESCRIPTION OF THE INVENTION

Figure 1:
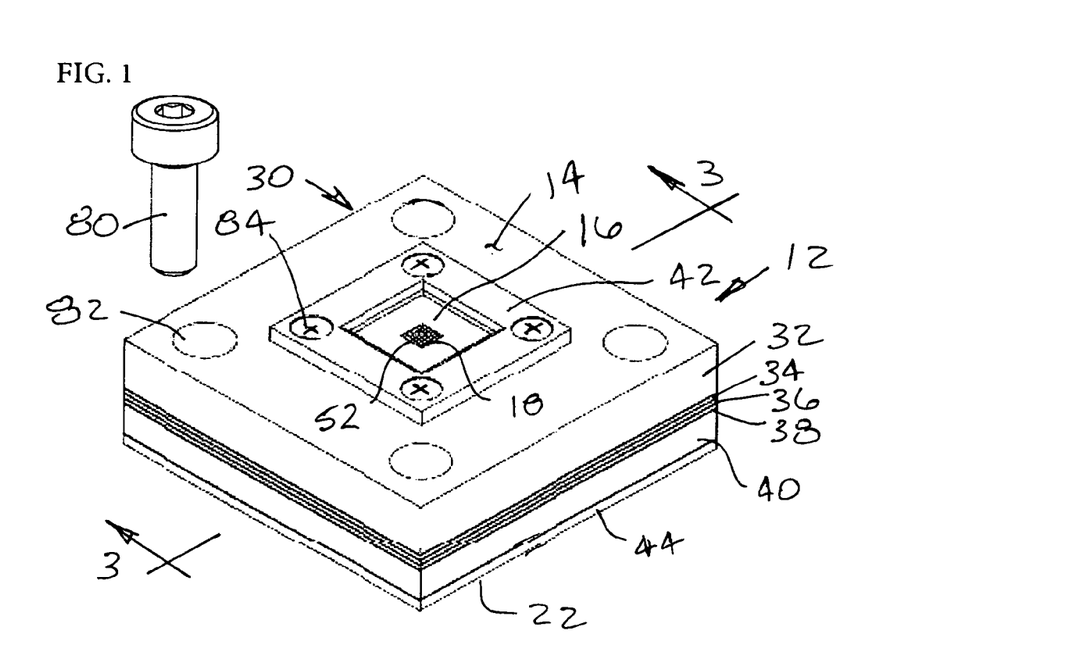
FIG. 1 is a perspective view of a top side of a micro via adapter socket.
Figure 2:
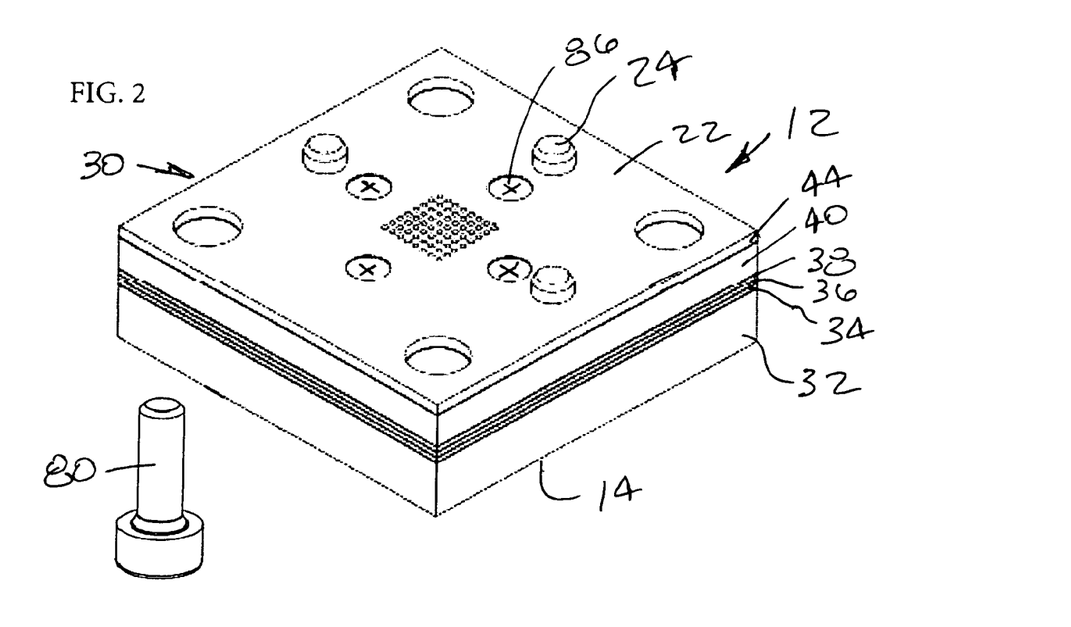
FIG. 2 is a perspective view of a back side of the micro via adapter socket.

FIG. 1 is a perspective view of a top side 14 of a micro via adapter socket 12, and FIG. 2 is a perspective view of a back side 22 of the micro via adapter socket 12. The adapter socket 12 is for electrically connecting electronic components with grid array contact spacings of 0.20 mm centers to grid array contacts of circuitry having larger spacings, such as contact grid array spacings of 0.50 mm centers. A component cavity 16 is provided in the top side 14 of the adapter socket 12. A micro-pin array 18 is centrally disposed in the component cavity 16 and has contact pins 52 spaced apart on 0.20 mm centers. FIG. 2 shows three locating pins 24 extending from the back side 22 of the micro via adapter socket 12. A contact pin array 26 also protrudes from the back side 22 for engaging associated circuitry contacts at 0.50 mm spacing.

Figure 3:
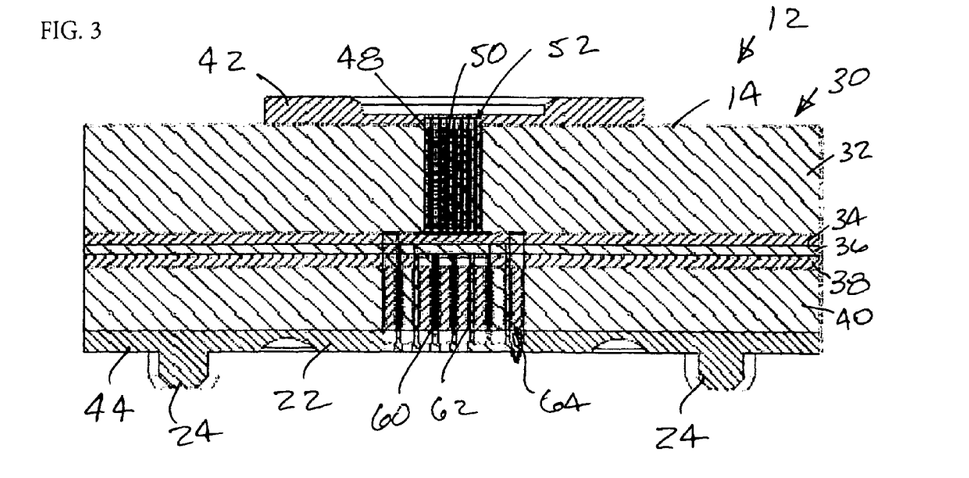
FIG. 3 is a sectional view of the micro via adapter socket taken along section line 3-3 of FIG. 1.

FIG. 3 is a sectional view of the adapter socket 12 taken along section line 3-3 of FIG. 1. The adapter socket includes a multilayer printed circuit board 30 which is preferably five layers sandwiched between a top plate 42 and a bottom plate 44. The multilayer PCB 30 includes an upper layer 32 and a lower layer 40, both of which are substantially thicker than inner layers 34, 36 and 38. The inner layers 34, 36 and 38 provide interconnect layers in the PCB 30.

Figure 4:
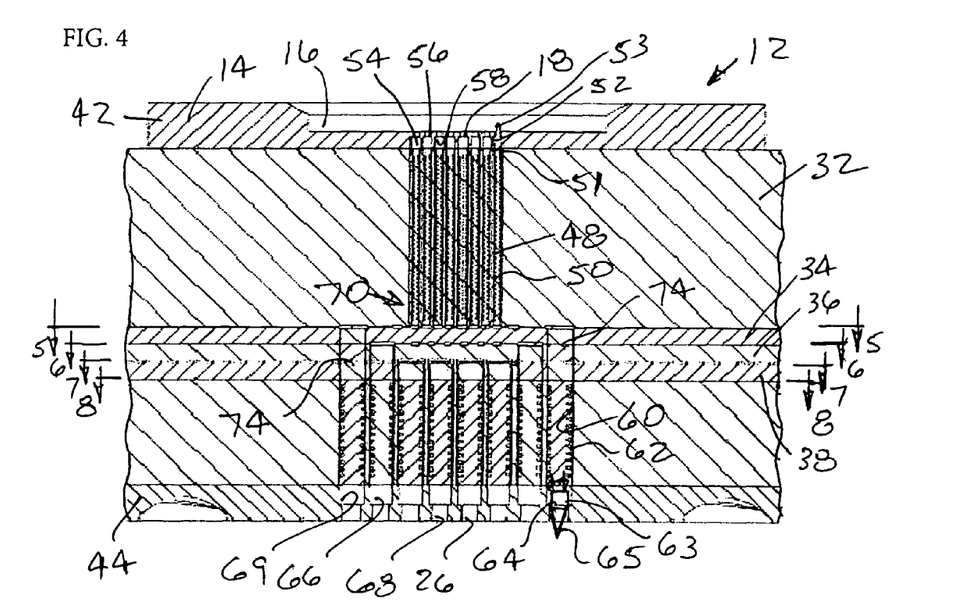
FIG. 4 is an enlarged view of a portion of the sectional view of FIG. 3 showing in more detail an via array for the micro adapter socket.

FIG. 4 is an enlarged view of a portion of the sectional view of FIG. 3 showing a via adapter array 70 of the adapter socket 12. Formed into the upper layer 32 are micro vias 48, which are blind vias that are plated for receiving micro springs 50. The micro vias 48 are plated to make electronic contact with the micro springs 50. It should be noted that only an upper region of the micro vias 48 for making contact with the micro springs 50 must be fully plated for making sufficient electric contact with the micro pins 52. Disposed above the micro springs 50 are micro pins 52 (one shown in FIG. 4). Micro pins 52 are disposed within respective pin recesses 54 formed into the top plate 42. The top plate 42 provides a cover for the micro vias 48, retaining the micro pins within the micro vias 48. A port 56 is provided in the outward end of the pin recess 54 and extends through the top plate 42 to allow protrusion of the micro pins 52 therefrom. The port 56 is preferably of a smaller size than the pin recess 54 to define a shoulder 58 for retaining the micro pins 52 within the pin recesses 54, yet with diametrical clearance such that the micro pins 52 are freely slidable within the ports 56. The micro pins 52 preferably have an inward portion 51 and an outward probe portion 53, with the inward portions 51 being of a larger size than the outward probe portions 53. (See also FIG. 10).

Similarly, the mini vias 60 are provided into the lower layer 40 of the multilayer PCB 30 for receiving at 0.50 mm centers for receiving the mini springs 62. Located beneath the mini springs 62 are mini pins 64 which are disposed within pin recesses 66 in the bottom plate 44. Ports 68 extend through the bottom port 68 in registration with the mini vias 60 and the pin recesses 66 for receiving the mini pins 64 and slidably allow the mini pins 64 to slidably extend from within the bottom plate 44 for contacting contacts of a mating contact assembly to which the adapter socket 12 is mounted. The ports 68 are preferably of a smaller size than the pin recesses 66 and the mini vias 60 to define shoulders 69 for retaining the mini pins 64 within the pin recesses 66. The mini pins 64 are preferably freely slidable within the ports 68. The mini pins 64 preferably have an inward portion 63 and an outward probe portion 65, with the inward portions 63 being of a larger size than the outward probe portions 65. (See also FIG. 12).

Figure 5:
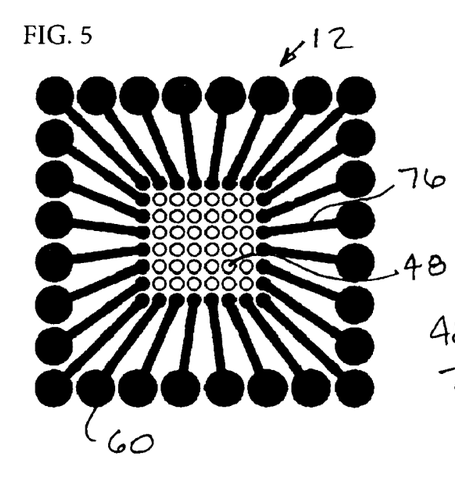
FIG. 5 is a partial section view of the via adapter array taken along section line 5-5 of FIG. 4.
Figure 6:
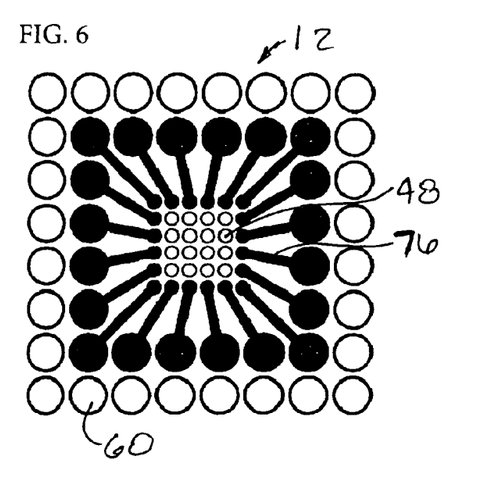
FIG. 6 is a partial section view of the via adapter array taken along section line 6-6 of FIG. 4.
Figure 7:
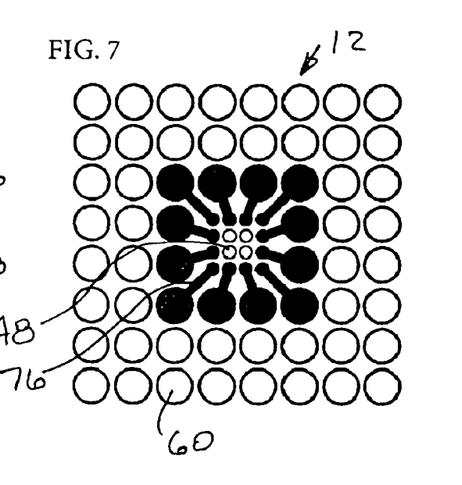
FIG. 7 is a partial section view of the via adapter array taken along section line 7-7 of FIG. 4.
Figure 8:
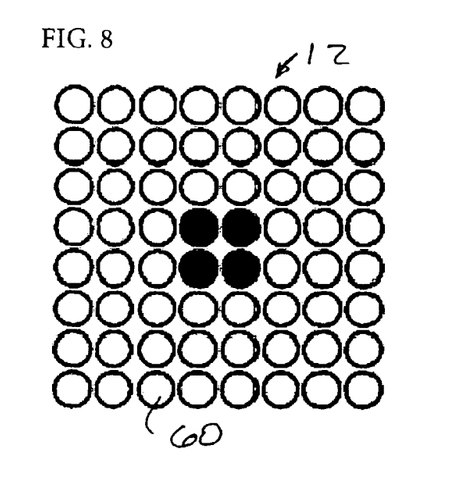
FIG. 8 is a partial section view of the via adapter array taken along section line 8-8 of FIG. 4.

FIGS. 5-8 are taken at various sectional views to show the conductive track 76 in the interconnect layers 72 which extend between the interconnect vias 74 of the inner layers 34, 35 and 36 to electrically connect the micro vias 48 to respective ones of the mini vias 60. The interconnect layers 72 provided by layers 34, 36 and 38 of the multilayer PCB 30 define interconnect vias 74 and conductive traces or tracks 76 for electrically connecting various respective ones of the micro vias 48 to corresponding ones of the mini vias 60. FIG. 5 is a partial sectional view of the via adapter array 70 taken along section line 5-5 of FIG. 4. FIG. 5 shows an outer region, outer periphery of the micro vias 48 connected to an outer perimeter of the mini vias 60 by means of the interconnect vias 74 and the conductive tracks 76 of the via adapter array 70. FIG. 6 is a sectional view of the via adapter array 70 taken along section line 6-6 of FIG. 4. An intermediate portion of the micro vias 48 are shown connected to the mini vias 60 by the interconnect vias 74 and the conductive tracks 76. FIG. 7 is a sectional view of the via adapter array 70 taken along section line 7-7 of FIG. 4. FIG. 7 shows an inward portion of the micro vias 48 connected to the mini vias 60 by the interconnect vias 74 and the conductive tracks 76 of the via adapter array 70. FIG. 8 is a sectional view of the via adapter array 70 taken along section line 8-8 of FIG. 4 and shows the innermost micro vias 48 connected to the mini vias 60. The interconnect vias 74 and the conductive tracks 76 are shown.

FIGS. 1 and 2 also show one of the four thru-bolts 80 which fit within the four holes 82 for providing structural rigidity to the multilayer PCB 30, and which secure the PCB 30 to another circuit board or test board. The thru-bolts 80 have hex heads and are used to provide a mounting force against the compliance force provided by the mini pins 64 of the contact pin array 26 against contact pads mounted to the circuit board to which micro via adapter socket 12 is mounted. Also shown are apertures for receiving fasteners 84 for securing the top plate 42 to the multilayer PCB 30, and fasteners 86 for securing the bottom plate 44 to the back side 22 of the multilayer PCB 30.

Figure 9:
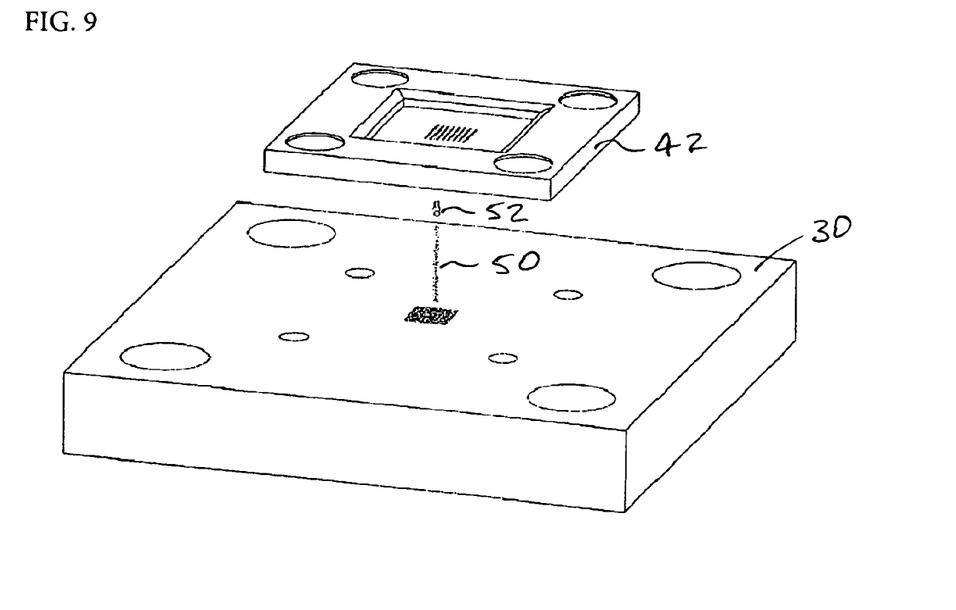
FIG. 9 is an exploded view of the top side of the miro via adapter socket.
Figure 10:
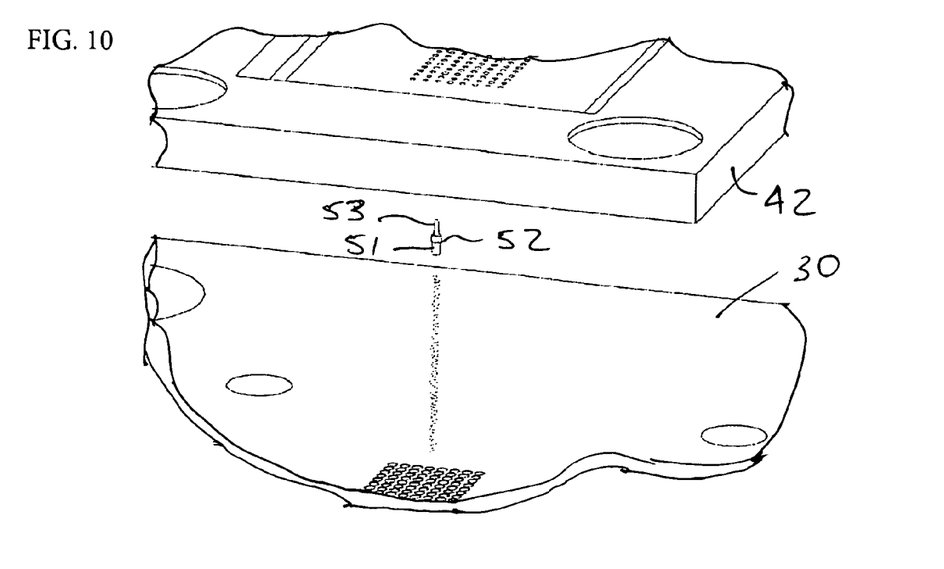
FIG. 10 is an enlarged view of a portion of the top side view of FIG. 9.

FIG. 9 is an exploded view of the top side of the miro via adapter socket, and FIG. 10 is an enlarged view of a portion of the top side view of FIG. 9. The top plate 42 is shown disposed above the PCB 30 with one of the micro springs 50 and one of the micro pins 52 shown. The micro spring 50 is preferably formed of tightly wound piano wire. The micro pin 52 will preferably fit within one of the micro vias 48 and the micro pin 52 will preferably slidably fit within the top plate 42 in accordance with the above discussion noted in reference to FIG. 4.

Figure 11:
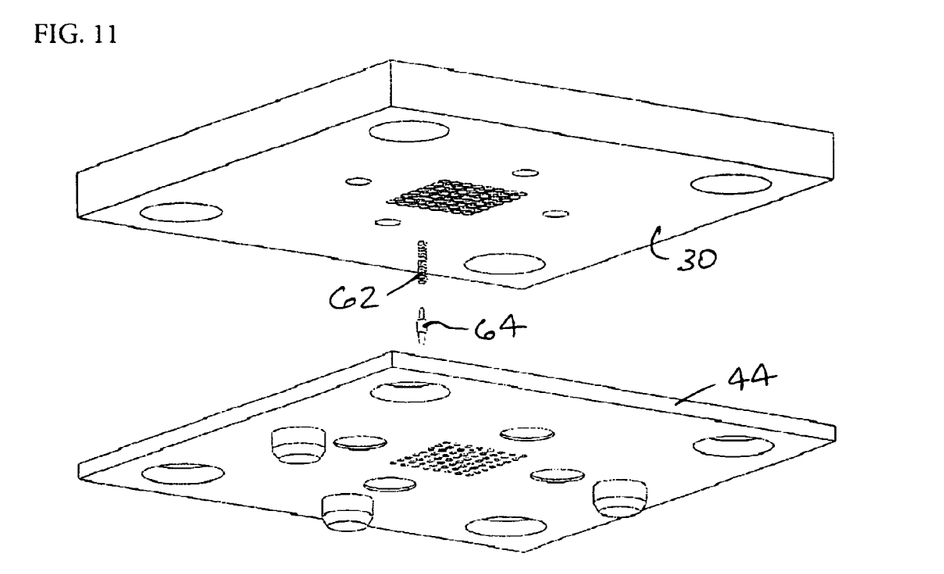
FIG. 11 is an exploded view of the back side of the micro via adapter socket.
Figure 12:
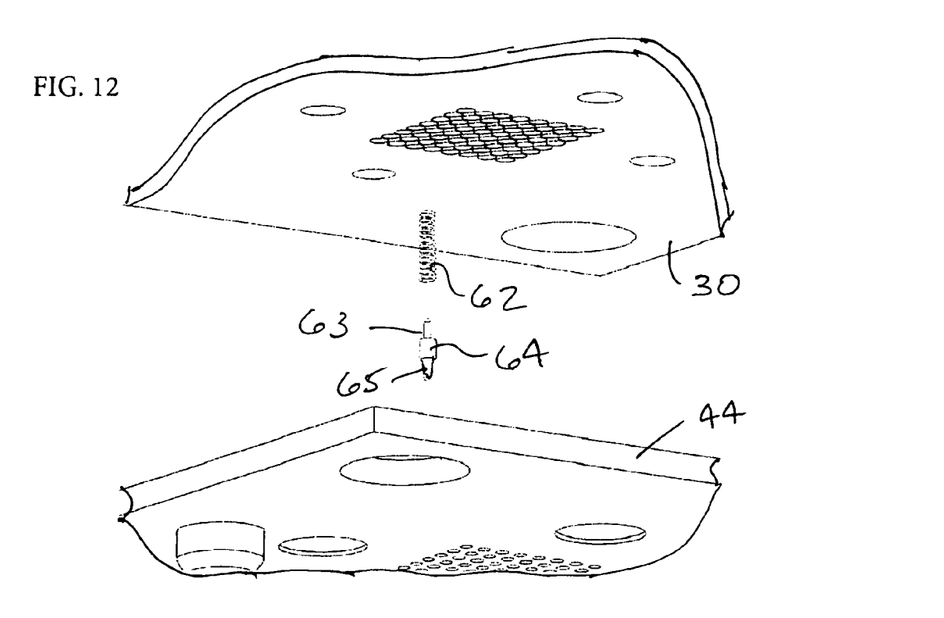
FIG. 12 is an enlarged view of a portion of the back side view of FIG. 11.

FIG. 11 is an exploded view of the back side of the micro via adapter socket, FIG. 12 is an enlarged view of a portion of the back side view of FIG. 11. The bottom plate 44 is shown disposed beneath the PCB with one of the mini springs 62 and one of the mini pins 64 shown. The mini spring 62 is preferably formed of a tightly wound piano wire. The mini spring 62 will fit within one of the mini vias 60 and the min pin 64 will preferably fit within the bottom plate 44, as noted above in reference to FIG. 4

The present invention provides a micro via adapter socket for adapting components which are made on 0.20 mm spacing for mating with circuitry having contact arrays at 0.50 mm spacing. The micro via adapter socket provides advantages of being able to manufacture adapter sockets from printed circuit boards having vias for interconnecting corresponding contacts. Conductive barrels for receiving micro springs and micro pins are provided by vias formed directly into the multilayer PCB, as well as mini vias for receiving mini springs and mini pins at 0.50 mm spacing, with the interconnect layers of the multilayer PCB electrically connecting respective ones of the micro vias and mini vias there between.

Although the preferred embodiment has been described in detail, it should be understood that various changes, substitutions and alterations can be made therein without departing from the spirit and scope of the invention as defined by the appended claims.

What is claimed is:

1. A micro via adapter socket for electrically connecting contacts of a component package to associated circuitry, said adapter socket comprising:
   a printed circuit board having an upper layer, a lower layer and intermediate interconnect layers;
   a plurality of micro-springs and micro-pins;
   a plurality of mini-springs and mini-pins, wherein said micro-springs and said micro-pins are substantially smaller in diameter than said mini-springs and said mini-pins;

said upper layer having micro vias formed therein, said micro vias defining a first array of vias for receiving respective ones of said micro-springs;

said lower layer having mini vias formed therein, said mini vias defining a second array vias for receiving respective ones of said mini-springs;

a top plate for securing above said upper layer, said top plate having a plurality of micro pin ports spaced apart in alignment for registering with respective ones of said micro vias, wherein said top plate is disposed above a top side of said first layer with said micro pin ports aligned in registration with said micro vias and said micro-pins extending through said micro pin ports and outward of said top plate, and said micro-pins engaging and in electrical contact with said micro-springs;

a bottom plate for securing beneath said lower layer, said bottom plate having a plurality of mini-pin ports spaced apart for registering with respective ones of said mini vias, wherein said bottom plate is disposed beneath a back side of said lower layer with said mini pin ports aligned with said mini vias and said micro-pins extending through said mini-pin ports and outward of said bottom plate, and said mini-pins engaging and in electrical contact with said mini-springs; and wherein said intermediate interconnect layers have conductive tracks which electrically connect said mini vias to said micro vias, which electrically connect said micro-pins to respective ones of said mini-pins.

2. The micro via adapter according to claim 1, wherein said micro vias have conductive plating on at least upper portions of said micro vias, and said micro vias receive respective ones of said micro-pins and said micro-springs, and at least one of said micro-pins and said micro-springs contact said conductive plating and electrically connect there-between.

3. The micro via adapter according to claim 1, wherein said mini vias having conductive plating on at least lower portions of said mini vias, and said mini vias receive respective ones of said mini pins, said mini pins contacting said conductive plating and electrically connecting there-between.

4. The micro via adapter according to claim 1, wherein said mini vias and said micro vias are electrically connected by respective ones of said conductive tracks.

5. The micro via adapter according to claim 4, wherein innermost ones of said mini vias are connected to innermost ones of said micro vias, and outermost ones of said mini vias are connected to outermost ones of said micro vias.

6. The micro via adapter according to claim 1, wherein said mini springs are the same length and said micro pins are the same length.

7. A micro via adapter socket for electrically connecting contacts of a component package to associated circuitry, said adapter socket comprising:

a printed circuit board having an upper layer, a lower layer and intermediate interconnect layers;

a plurality of micro-springs and micro-pins;

a plurality of mini-springs and mini-pins, wherein said micro-springs and said micro-pins are substantially smaller in diameter than said mini-springs and said mini-pins;

said upper layer having micro vias formed therein, said micro vias defining a first array of blind vias for receiving respective ones of said micro-springs;

said lower layer having mini vias formed therein, said mini vias defining a second array of blind vias for receiving respective ones of said mini-springs;

a top plate for securing above said upper layer, said top plate having a plurality of micro pin recesses spaced apart for registering with respective ones of said micro vias, said micro pin recesses sized for removably receiving respective ones of said micro pins which are urged to extend outward of said top plate by respective ones of said micro-springs, and wherein each of said pin recesses is aligned with a respective micro pin port for passing an end of said micro-pins outward of said top plate;

a bottom plate for securing beneath said lower layer, said bottom plate having a plurality of mini-pin recesses spaced apart for registering with respective ones of said mini vias, said mini-pin recesses sized for removably receiving respective ones of said mini-pins which are urged to extend outward of said top plate by respective ones of said mini-springs, and wherein each of said mini-pin recesses is aligned with a respective mini-pin port for passing an end of said micro pins outward of said top plate; and wherein said intermediate interconnect layers have conductive tracks which electrically connect said mini vias to said micro vias, which electrically connect said micro-pins to respective ones of said mini-pins.

8. The micro via adapter according to claim 7, wherein said micro vias have conductive plating on at least upper portions of said micro vias, and said micro vias receive respective ones of said micro-pins and said micro-springs, and at least one of said micro-pins and said micro-springs contact said conductive plating and electrically connect there-between.

9. The micro via adapter according to claim 7, wherein said mini vias having conductive plating on at least lower portions of said mini vias, and said mini vias receive respective ones of said mini pins, said mini pins contacting said conductive plating and electrically connecting there-between.

10. The micro via adapter according to claim 7, wherein innermost ones of said mini vias are connected to innermost ones of said micro vias, and outermost ones of said mini vias are connected to outermost ones of said micro vias.

11. The micro via adapter according to claim 10, wherein said mini springs are the same length and said micro pins are the same length.

12. A micro via adapter socket for electrically connecting contacts of a component package to associated circuitry, said adapter socket comprising:

a printed circuit board having an upper layer, a lower layer and intermediate interconnect layers;

a plurality of micro-springs and micro-pins;

a plurality of mini-springs and mini-pins, wherein said micro-springs and said micro-pins are substantially smaller in diameter than said mini-springs and said mini-pins, and said mini springs are the same length and said micro pins are the same length;

said upper layer having micro vias formed therein, said micro vias defining a first array of blind vias for receiving respective ones of said micro-springs;

said lower layer having mini vias formed therein, said mini vias defining a second array of blind vias for receiving respective ones of said mini-springs;

a top plate for securing above said upper layer, said top plate having a plurality of micro pin recesses spaced apart for registering with respective ones of said micro vias, said micro pin recesses sized for removably receiving respective ones of said micro pins which are urged to extend outward of said top plate by respective ones of said micro-springs, and wherein each of said pin recesses is aligned with a respective micro pin port for passing an end of said micro-pins outward of said top plate;

a bottom plate for securing beneath said lower layer, said bottom plate having a plurality of mini-pin recesses spaced apart for registering with respective ones of said mini vias, said mini-pin recesses sized for removably receiving respective ones of said mini-pins which are urged to extend outward of said top plate by respective ones of said mini-springs, and wherein each of said mini-pin recesses is aligned with a respective mini-pin port for passing an end of said micro pins outward of said top plate;

said micro vias having conductive plating on at least upper portions of said micro vias, and said micro vias receive respective ones of said micro-pins and said micro-springs, and at least one of said micro-pins and said micro-springs contact said conductive plating and electrically connect there-between; and wherein said intermediate interconnect layers have conductive tracks which electrically connects said mini vias to said micro vias, which electrically connects said micro-pins to respective ones of said mini-pins.

13. The micro via adapter according to claim 12, wherein said mini vias having conductive plating on at least lower portions of said mini vias, and said mini vias receive respective ones of said mini pins, said mini pins contacting said conductive plating and electrically connecting there-between.

14. The micro via adapter according to claim 12, wherein innermost ones of said mini vias are connected to innermost ones of said micro vias, and outermost ones of said mini vias are connected to outermost ones of said micro vias.

* * * * *